United States Patent
Yen et al.

(10) Patent No.: US 6,991,895 B1
(45) Date of Patent: Jan. 31, 2006

(54) DEFOCUS-INVARIANT EXPOSURE FOR REGULAR PATTERNS

(75) Inventors: Anthony Yen, Austin, TX (US); Shinn-Sheng Yu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 195 days.

(21) Appl. No.: 10/224,186

(22) Filed: Aug. 20, 2002

(51) Int. Cl.
*G03F 7/00* (2006.01)

(52) U.S. Cl. .......................... 430/394; 430/5
(58) Field of Classification Search .............. 430/5, 430/394
See application file for complete search history.

(56) References Cited

U.S. PATENT DOCUMENTS

| | | | | |
|---|---|---|---|---|
| 5,424,552 A | * | 6/1995 | Tsuji et al. ................. | 250/548 |
| 5,680,588 A | | 10/1997 | Gortych et al. ............. | 395/500 |
| 5,863,712 A | | 1/1999 | Von Bunau et al. ........ | 430/396 |
| 6,057,065 A | | 5/2000 | Rolson ......................... | 430/5 |
| 6,064,475 A | | 5/2000 | Chen et al. .................. | 356/138 |
| 6,096,457 A | | 8/2000 | Pierrat ........................... | 430/5 |
| 6,453,274 B2 | * | 9/2002 | Kamon ......................... | 703/2 |
| 6,492,073 B1 | * | 12/2002 | Lin et al. ..................... | 430/5 |
| 6,677,088 B2 | * | 1/2004 | Magome et al. ............ | 430/5 |
| 6,787,789 B2 | * | 9/2004 | Van Der Laan ............ | 250/548 |
| 6,818,362 B1 | * | 11/2004 | Lucas et al. ................. | 430/5 |

* cited by examiner

*Primary Examiner*—Amanda Walke
(74) *Attorney, Agent, or Firm*—Thomas, Kayden, Horstemeyer & Risley

(57) ABSTRACT

For a 2-dimensional periodic array of contact holes or islands, a depth-of-focus-enhancement lithographic scheme based on a combination of alternating phase-shifting mask and off-axis illumination is revealed. The scheme is achieved by choosing appropriate off-axis illumination and smaller numerical aperture such that only two diffraction orders, which are of equal distance from the pupil center, are collected in the first exposure. The image of the 2-dimensional periodic array can be formed by superposing a second exposure on the first. In the second exposure, another appropriate off-axis illumination and smaller numerical aperture is chosen such that another two diffraction orders, which are also of equal distance from the pupil center, are collected.

20 Claims, 5 Drawing Sheets

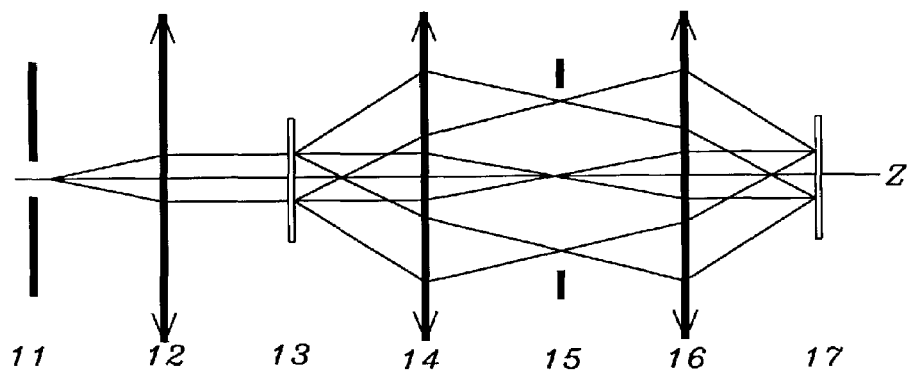
FIG. 1 - Prior Art
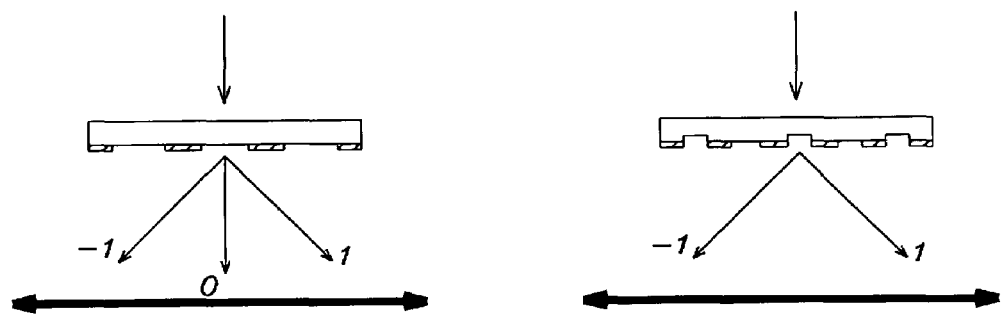
FIG. 2a - Prior Art
FIG. 2b - Prior Art
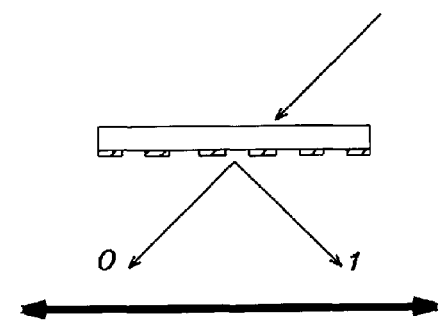
FIG. 2c - Prior Art

DEFOCUS-INVARIANT EXPOSURE FOR REGULAR PATTERNS

FIELD OF THE INVENTION

The invention relates to the general field of photolithography with particular reference to complex image formation of regular patterns.

BACKGROUND OF THE INVENTION

As the dimensions of integrated circuits become smaller and smaller, depth of focus (DOF) of the lithographic process employed to pattern them also becomes very small. If DOF of the conventional lithographic scheme approaches the control limit that can be provided by state-of-the-art exposure tools, then DOF-enhancement techniques must be taken into account.

In the literature, there are several ways that can enhance DOF. One is the introduction of alternating phase-shifting mask (Alt-PSM), and the other, off-axis illumination (OAI).

To illustrate how these techniques can enhance DOF, we first consider the imaging process of an exposure tool. Shown in FIG. 1 is a schematic sketch of a double-telecentric projection imaging system with Kohler-type illumination, which ensures that illumination is very uniform on the mask. The spherical wave from the source 11 after the condenser lens 12 becomes the plane wave illuminating the mask 13. The diffracted waves behind the mask are collected by projection lenses 14, 16 to form images on the wafer 17. The pupil 15 defines the highest spatial frequency that can be captured by the imaging system. The mask plane is the Fourier-transform plane of the source plane. The pupil plane, being the Fourier-transform plane of the mask plane, is also the image plane of the source plane. The wafer plane, being the Fourier-transform plane of the pupil plane, is also the image plane of the mask plane.

It can be readily shown that if all the diffraction spots on the pupil plane are of equal distance from the pupil center, then the resulting image on wafer will be independent of z. That is, DOF will be infinite.

We use the imaging of one-dimensional (1-D) line/space as examples. Shown in FIG. 2a is the conventional lithographic scheme, which employs on-axis illumination along with a binary mask (BIM). The DOF of such a lithographic process cannot be very large since the collected diffraction orders, including order 0, order−1, and order 1, to form image on the wafer are not all of equal distance from the pupil center. If we only collect order 0, the image can't be formed since at least two diffraction orders must be collected.

The principal of Alt-PSM is illustrated in FIG. 2b. One of the two clear regions beside a dark feature of mask patterns is phase-shifted by 180 degrees to eliminate diffraction order 0. DOF will be very large since only order −1 and order 1 are collected and the two diffraction orders are of equal distance from the pupil center. The principal of OAI is illustrated in FIG. 2c. Order 0 is shifted from the pupil center by illuminating the mask off-axially. For line/space patterns of a certain pitch, specific illumination can be chosen such that order 0 and order 1 or order 0 and order −1 are of equal distance from the pupil center. Therefore, DOF will be very large.

A routine search of the prior art was performed with the following references of interest being found:

In U.S. Pat. No. 6,096,457, Pierrat shows an off-axis illumination process for a phase shift mask. Rolson (U.S. Pat. No. 6,057,065), Von Bunau (U.S. Pat. No. 5,863,712), and Gortych et al. (U.S. Pat. No. 5,680,588), all show related patents.

SUMMARY OF THE INVENTION

It has been an object of the present invention to provide a process for forming an image with very large depth of focus.

A further object has been that said image be of a 2-dimensional periodic pattern consisting of first and second arrays with their lattices all expanded by two linearly independent primitive vectors $a_1$ and $a_2$.

A still further object has been that said second array be displaced from said first array by $a_1/2+a_2/2$.

These objects have been achieved by arranging for at least two collected diffraction orders to be of equal distance from the pupil center. This has been done by using an alternating phase-shifting mask with said first array being phase-shifted by 180 degrees with respect to said second array and by choosing first appropriate off-axis illumination of low σ(size) and smaller numerical aperture. To form the image of said 2-D periodic pattern, at least three diffraction orders should be collected. Another independent set of diffraction orders, which are also of equal distance from the pupil center, is generated by choosing second appropriate off-axis illumination of low σ(size). By exposing said first and said second off-axis illumination separately, a complete image of said 2-dimensional periodic pattern with very large depth of focus results.

BRIEF DESCRIPTION OF THE DRAWINGS

FIG. 1 is a schematic representation of a projection imaging system.

FIG. 2a illustrates a conventional lithographic scheme, which employs on-axis illumination along with a binary mask.

FIG. 2b illustrates the principle of alternating phase-shifting mask.

FIG. 2c illustrates the principle of off-axis illumination.

DESCRIPTION OF THE PREFERRED EMBODIMENTS

As illustrated in the background section, the introduction of Alt-PSM or OAI will increase the DOF of 1-D line/space patterns significantly by making collected diffraction orders to be of equal distance from the pupil center. However, for general 2-D patterns, the same method may not be directly applicable if conventional single-exposure lithographic scheme is adopted.

Figure 3A:
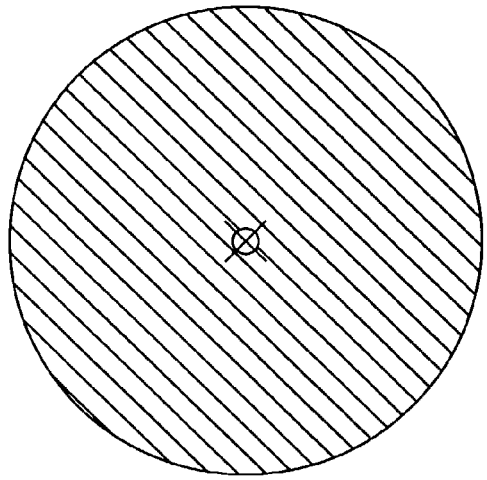
FIG. 3a illustrates employed on-axis illumination of low σ(size), where 'x' stands for the location of the pupil center.
Figure 3B:
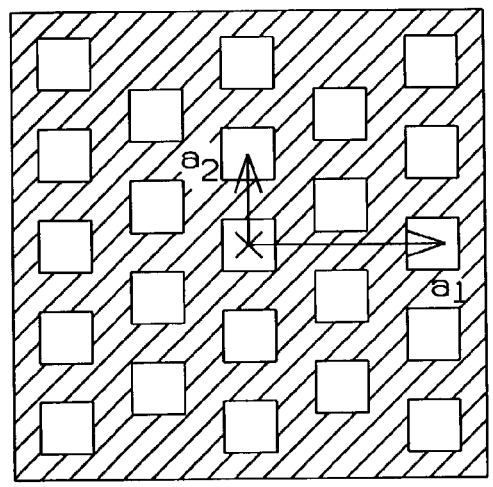
FIG. 3b illustrates a 2-D periodic pattern of contact holes with its lattice expanded by two primitive vectors $a_1$ and $a_2$ and its basis consisting of two components located at 0 and $a_1/2+a_2/2$, respectively.
Figure 3C:
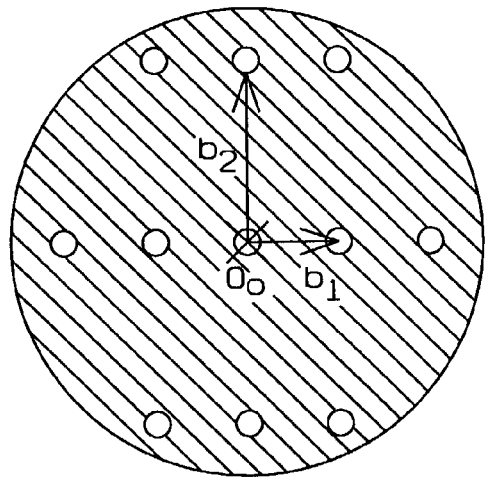
FIG. 3c illustrates the diffraction orders on the pupil plane of the mask of FIG. 3b under the illumination of FIG. 3a, where 'x' stands for the location of the pupil center.

Consider, for example, the following 2-D periodic array of contact holes, comprising a lattice expanded by two linearly independent (i.e., non-parallel) primitive (i.e., shortest) vectors $a_1$ and $a_2$ as well as a two-component basis with each component (i.e., contact hole) located at 0 and $a_1/2+a_2/2$, respectively, as shown in FIG. 3b. By requiring $a_i b_j = 2\pi \delta_{ij}$ ('·' being the vector dot product defined in the literature), the location of diffraction orders on the pupil pane also comprises a lattice (reciprocal lattice) expanded by two linearly independent primitive vectors $b_1$ and $b_2$. Here, $b_1$ and $b_2$ can be directly constructed from $a_1$ and $a_2$, as shown: $b_1=2\pi a_2 \times z/(a_1 \cdot (a_2 \times z))$, $b_2=2\pi z \times a_1/(a_1 \cdot (a_2 \times z))$ ('x' being the vector cross product defined in the literature, and $z=a_1 \times a_2/|a_1 \times a_2|$). With such a convention, the edge of the pupil is located at the radius of $2\pi NA/\lambda$, where NA is the numerical aperture of the imaging system, and $\lambda$ is the wavelength of the source. If on-axis illumination of low σ(size) is used, as shown in FIG. 3a, then all diffraction orders collected by the pupil is shown in FIG. 3c. (The definition of σ (size) can be found in the literature, e.g., A. K. Wong, "Resolution Enhancement Techniques in Optical Lithography", SPIE Press, pp. 24 (2001)) Because of the presence of the diffraction order Oo at the pupil center, DOF will be small.

Figure 4A:
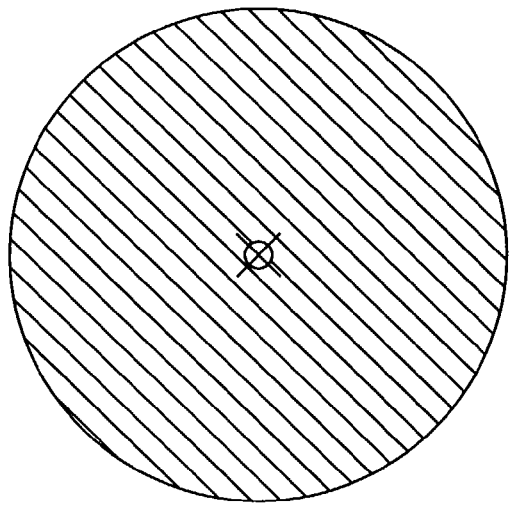
FIG. 4a illustrates employed on-axis illumination of low σ(size), where 'x' stands for the location of the pupil center.
Figure 4B:
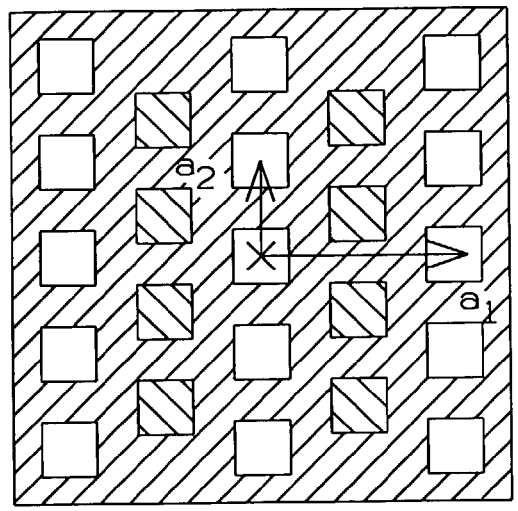
FIG. 4b illustrates an alternating phase-shifting mask generated from the mask in FIG. 3b by shifting the phase of the component at $a_1/2+a_2/2$ by 180 degrees.
Figure 4C:
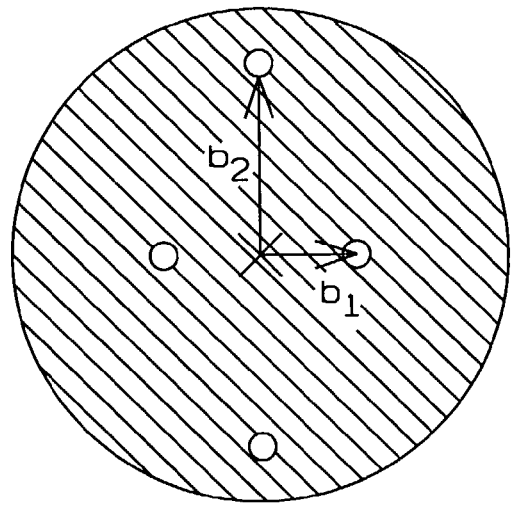
FIG. 4c illustrates the diffraction orders on the pupil plane of the mask of FIG. 4b under the illumination of FIG. 4a, where 'x' stands for the location of the pupil center.

If we shift the phase of the component at $a_1/2+a_2/2$, as shown in FIG. 4b, and if on-axis illumination of low σ(size) is used, as shown in FIG. 4a, then the diffraction orders on the pupil plane are shown in FIG. 4c. Even though the diffraction order at the pupil center has disappeared, DOF will also be small since at least three diffraction orders should be collected to image 2-D patterns like an array of contact holes and the lowest three diffraction orders are not all of equal distance from the pupil center.

Figure 5A:
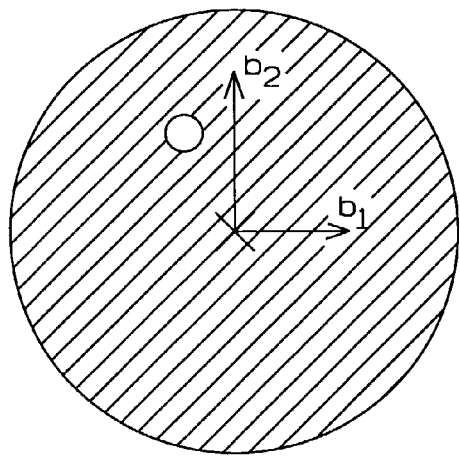
FIG. 5a illustrates off-axis illumination of low σ(size) used for the first exposure of this invention, where 'x' stands for the location of the pupil center.
Figure 5B:
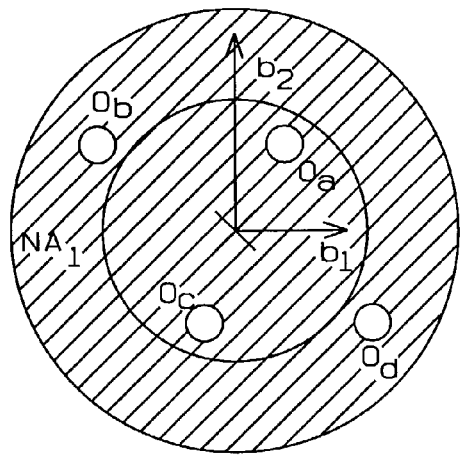
FIG. 5b illustrates the diffraction orders on the pupil plane of the mask in FIG. 4b under the illumination of FIG. 5a, where 'x' stands for the location of the pupil center.
Figure 5C:
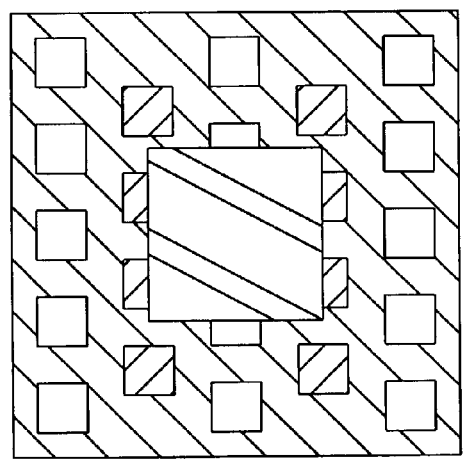
FIG. 5c illustrates a small portion of the aerial image on the wafer plane using the mask in FIG. 4b and the illumination in FIG. 5a. Lighter color means higher intensity.
Figure 6A:
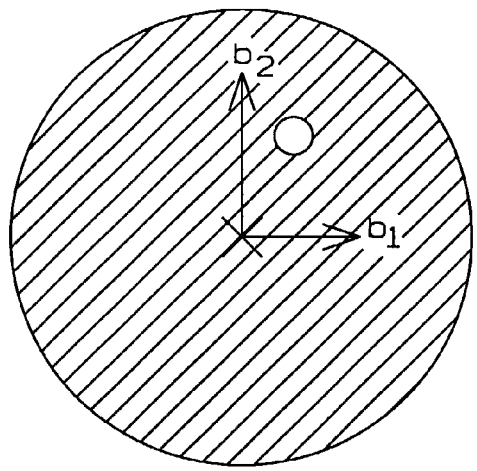
FIG. 6a illustrates off-axis illumination of low σ(size) used for the second exposure of this invention, where 'x' stands for the location of the pupil center.
Figure 6B:
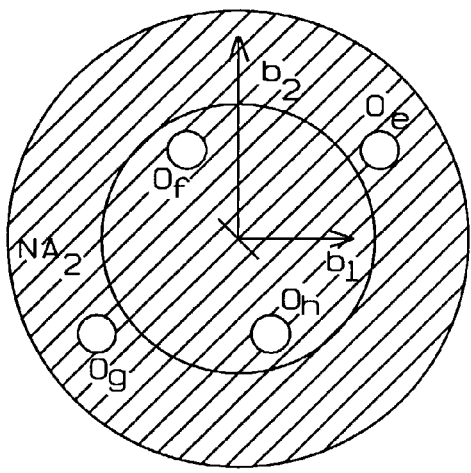
FIG. 6b illustrates the diffraction orders on the pupil plane of the mask in FIG. 4b under the illumination of FIG. 6a, where 'x' stands for the location of the pupil center.
Figure 6C:
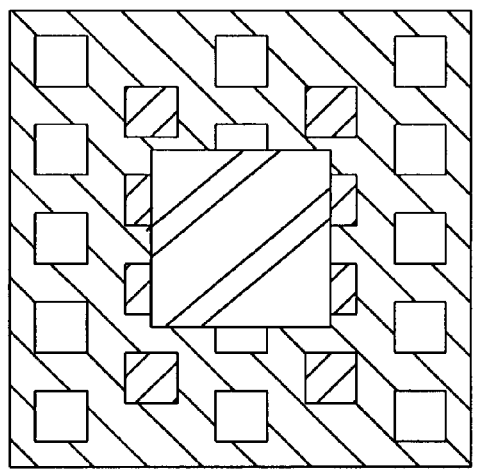
FIG. 6c illustrates a small portion of aerial image on the wafer plane using the mask in FIG. 4b and the illumination in FIG. 6a. Lighter color means higher intensity.
Figure 7:
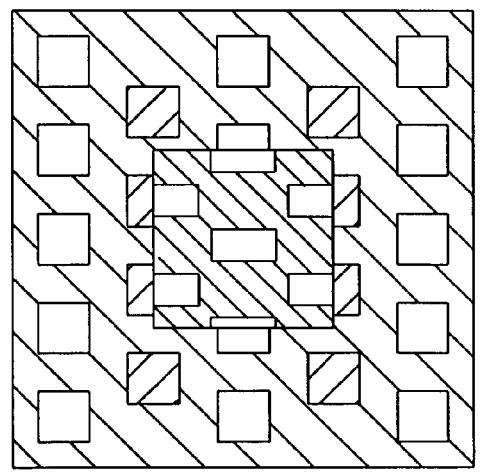
FIG. 7 illustrates the final aerial image on the wafer plane after the first and the second exposure. Lighter color means higher intensity.

In the following, we show that large DOF can be achieved by combining Alt-PSM and OAI. If off-axis illumination of low σ(size)(i.e., almost a point source) located at $-b_1/2+b_2/2$ is chosen for the first exposure, as shown in FIG. 5a, then all the diffraction orders on the pupil plane will shift by this amount, as shown in FIG. 5b. (In this document, whenever we talk about the position of the source, we always mean its corresponding position on the pupil plane.) We see from FIG. 5b that diffraction orders Oa, Ob, Oc, Od are located on the pupil plane at $b_1/2+b_2/2$, $-3b_1/2+b_2/2$, $-b_1/2-b_2/2$, $3b_1/2-b_2/2$. Oa and Oc are of equal distance from the pupil center, so are Ob and Od, but not Oa, Ob, Oc, Od all together. If NA of the exposure tool is lowered to $NA_1$ such that $|b_1/2+b_2/2|<NA_1<|3b_1/2-b_2/2|$, then only diffraction orders Oa dnd Oc are collected, then DOF for the first exposure will be very large. However, collecting only two diffraction orders achieves a wafer image, shown in FIG. 5c, which is not similar to the mask layout. So, we should do the second exposure. This time, off-axis illumination of low σ(size) located at $b_1/2+b_2/2$ is adopted, as shown in FIG. 6a. The diffraction orders on the pupil plane are shown in FIG. 6b. We see from FIG. 6b that diffraction orders Oe, Of, Og, Oh are located on the pupil plane at $3b_1/2+b_2/2$, $-b_1/2+b_2/2$, $-3b_1/2-b_2/2$, $b_1/2-b_2/2$. This time, diffraction orders Oe and Of are of equal distance from the pupil center, so are Og and Oh, but not Oe, Of, Og, Oh all together. Again, lowering value of numerical aperture to $NA_2$ such that $|b_1/2-b_2/2|<NA_2<|3b_1/2+b_2/2|$. Then, only diffraction orders Of and Oh are collected. The image of the second exposure is shown in FIG. 6c. The superposition of intensity from the first and the second exposure is shown in FIG. 7, which will produce a wafer image very similar to the intended design except that the tone are reversed. So, in real application, if we want to print images of contact holes on the wafer with a clear-tone mask, negative-tone photoresist should be employed to achieve this purpose.

What is claimed is:

1. A method for image formation, comprising:
providing an imaging system with a source plane, an object plane, a pupil plane, and an image plane, and having a variable numerical aperture;
providing around said image plane a substrate equipped with image-recording media;
providing around said object plane a mask having a pattern consisting of first and second arrays of polygons;
providing around said source plane first and second illumination of low σ(size);
locating said first illumination at a position on said source plane corresponding to position $-b_1/2+b_2/2$ or $b_1/2-b_2/2$ on said pupil plane, and setting said numerical aperture to a first value $NA_1$ such that $|b_1/2+b_2/2|<NA_1<|3b_1/2-b_2/2|$, then exposing said substrate through said imaging system thereby forming a first image;
then locating said second illumination at a position on said source plane corresponding to position $b_1/2+b_2/2$ or $-b_1/2-b_2/2$ on said pupil plane, and setting said numerical aperture to a second value $NA_2$ such that $|b_1/2+b_2/2|<NA_2<|3b_1/2-b_2/2|$, then exposing said substrate through said imaging system thereby forming a second image that is superimposed on said first image.

2. The method described in claim 1 wherein either array of polygons is expanded by two linearly independent primitive vector $a_1$ and $a_2$.

3. The method described in claim 1 wherein said first array is displaced from said second array by $(a_1+a_2)/2$.

4. The method described in claim 1 wherein said first array is phase-shifted by 180 degrees with respect to said second array.

5. The method described in claim 1 wherein $b_1=2\pi a_2 \times z/(a_1 \cdot (a_2 \times z))$ and $b_2=2\pi z \times a_1/(a_1 \cdot (a_2 \times z))$, where $z=a_1 \times a_2/|a_1 \times a_2|$.

6. The method described in claim 1 wherein said polygons on said mask are either clear tone or dark tone.

7. A method for imaging patterns as part of manufacturing an integrated circuit device, comprising:

providing an imaging system with a source plane, an object plane, a pupil plane, and an image plane, and having a variable numerical aperture;

providing around said image plane a substrate coated with negative photoresist;

providing around said object plane a mask having a pattern consisting of first and second arrays of clear-tone contact holes;

providing around said source plane first and second illumination of low σ(size);

locating said first illumination at a position on said source plane corresponding to position $-b_1/2+b_2/2$ or $b_1/2-b_2/2$ on said pupil plane, and setting said numerical aperture to a first value $NA_1$ such that $|b_1/2+b_2/2|<NA_1<|3b_1/2-b_2/2|$, then exposing said substrate through said imaging system thereby forming a first image;

then locating said second illumination at a position on said source plane corresponding to position $b_1/2+b_2/2$ or $-b_1/2-b_2/2$ on said pupil plane, and setting said numerical aperture to a second value $NA_2$ such that $|b_1/2+b_2/2|<NA_2<|3b_1/2-b_2/2|$, then exposing said substrate through said imaging system thereby forming a second image that is superimposed on said first image.

8. The method described in claim 7 wherein either array of contact holes is expanded by two linearly independent primitive vector $a_1$ and $a_2$.

9. The method described in claim 7 wherein said first array is displaced from said second array by $(a_1+a_2)/2$.

10. The method described in claim 7 wherein said first array is phase-shifted by 180 degrees with respect to said second array.

11. The method described in claim 7 wherein $b_1=2\pi a_2 \times z/(a_1\cdot(a_2\times z))$ and $b_2=2\pi z\times a_1/(a_1\cdot(a_2\times z))$, where $z=a_1\times a_2/|a_1\times a_2|$.

12. A method for imaging patterns as part of manufacturing an integrated circuit device, comprising:

providing an imaging system with a source plane, an object plane, a pupil plane, and an image plane, and having a variable numerical aperture;

providing around said image plane a substrate equipped with image-recording media;

providing around said object plane a mask having a pattern consisting of first and second arrays of clear-tone islands;

providing around said image plane first and second illumination of low σ(size);

locating said first illumination at a position on said source plane corresponding to position $-b_1/2+b_2/2$ or $b_1/2-b_2/2$ on said pupil plane, and setting said numerical aperture to a first value $NA_1$ such that $|b_1/2+b_2/2|<NA_1<|3b_1/2-b_2/2|$, then exposing said substrate through said imaging system thereby forming a first image;

then locating said second illumination at a position on said source plane corresponding to position $b_1/2+b_2/2$ or $-b_1/2-b_2/2$ on said pupil plane, and setting said numerical aperture to a second value $NA_2$ such that $|b_1/2+b_2/2|<NA_2<|3b_1/2-b_2/2|$, then exposing said substrate through said imaging system thereby forming a second image that is superimposed on said first image.

13. The method described in claim 12 wherein either array of islands is expanded by two linearly independent primitive vector $a_1$ and $a_2$.

14. The method described in claim 12 wherein said first array is displaced from said second array by $(a_1+a_2)/2$.

15. The method described in claim 12 wherein said first array is phase-shifted by 180 degrees with respect to said second array.

16. The method described in claim 12 wherein $b_1=2\pi a_2\times z/(a_1\cdot(a_2\times z))$ and $b_2=2\pi z\times a_1/(a_1\cdot(a_2\times z))$, where $z=a_1\times a_2/|a_1\times a_2|$.

17. A method for image formation, comprising:

providing a mask having a pattern;

providing first and second illumination;

locating said first illumination at a first position and exposing a substrate through said mask thereby forming a first image; and locating said second illumination at a second position and exposing said substrate through said mask thereby forming a second image that is superimposed on said first image.

18. A method for image formation, comprising:

providing an imaging system with a pupil plane;

providing a mask having a pattern with first and second arrays of polygons;

providing first and second illumination;

locating said first illumination at a first position and exposing a substrate through said mask thereby forming a first image; and locating said second illumination at a second position and exposing said substrate through said mask thereby forming a second image that is superimposed on said first image such that diffraction orders collected from the first and second illumination are of substantially equal distance from a center of the pupil plane.

19. The method of claim 18, where the first and second arrays of polygons are for forming contact holes or islands.

20. A method for intended wafer design formation, comprising:

providing a mask having a pattern;

providing first and second illumination;

locating said first illumination at a first position and exposing a substrate through said mask thereby forming a first image; and locating said second illumination at a second position and exposing said substrate through said mask thereby forming a second image that is superimposed on said first image such that a wafer image substantially similar to the intended wafer design is produced.

* * * * *